United States Patent [19]
Mitani

[11] Patent Number: 5,895,238
[45] Date of Patent: Apr. 20, 1999

[54] DOPING TECHNIQUE FOR MOS DEVICES

[75] Inventor: Hitoshi Mitani, Tokyo, Japan

[73] Assignee: NEC Corporation, Japan

[21] Appl. No.: 08/987,747

[22] Filed: Dec. 9, 1997

[30] Foreign Application Priority Data

Dec. 12, 1996 [JP] Japan ................... 8-331890

[51] Int. Cl.⁶ .................................. H01L 21/316
[52] U.S. Cl. .................. 438/232; 438/302; 438/438; 257/344; 257/409
[58] Field of Search .................... 257/408, 409, 257/406, 244, 235; 438/232, 302, 216, 225, 438

[56] References Cited

U.S. PATENT DOCUMENTS 5,565,700  10/1996  Chou et al. ..................... 257/408

OTHER PUBLICATIONS

Sidewall Spacer Construction, IBM Technical Disclosure Bulletin, Oct. 1986, vol. 19, NR 5, pp. 2342–2343.
Self–Aligned Borderless Diffusion contacts, IBM Technical Disclosure Bulletin, Dec. 1988, vol. 31, NR 7, , pp. 242–243.

*Primary Examiner*—Olik Chaudhuri
*Assistant Examiner*—William David Coleman
*Attorney, Agent, or Firm*—Hayes, Soloway, Hennessey, Grossman & Hage, P.C.

[57] ABSTRACT

A method for manufacturing a semiconductor device having impurity doped regions serving as source and drain and a semiconductor device obtained by the application of the same method are disclosed. In the method, a semiconductor substrate having a gate oxide is prepared, and a gate electrode is formed on the gate oxide. A first dielectric film is formed on the semiconductor substrate impurity ions of a first conductive type into the semiconductor substrate while permitting the gate electrode and the first dielectric film formed on the side walls of the gate electrode to serve as self-aligning masks. Then, a second dielectric film to be deposited on the first dielectric film, and an anisotropic etching is effected on at least on the second dielectric film to form on the side walls of the gate electrode spacers having a prescribed profile. Thereafter, impurity ions of a second conductive type are implanted into the semiconductor substrate while permitting the gate electrode and the spacers to serve as self-aligning masks.

5 Claims, 6 Drawing Sheets

FIG.5

# DOPING TECHNIQUE FOR MOS DEVICES

BACKGROUND OF THE INVENTION

1. Field of the Invention

The present invention pertains to a novel method for manufacturing a semiconductor device, and in particular a metal oxide semiconductor (MOS) device having source and drain of a lightly-doped drain (LDD) structure. The invention also relates to a semiconductor device per se fabricated by such a method.

2. Description of the Related Art

Due to an increased requirement towards larger integration of MOS memories in recent years, it has been desired to shorten a gate length or channel length in MOSFET. However, when a channel length is shortened, the intensity of electric field in the channel region increases to generate hot electrons in the vicinity of the drain, which may be entrapped into the gate oxide to cause deterioration of performance, such as variation in threshold voltage. Furthermore, due to the shortening of the channel length, depletion layers extending from the drain and source may reach the place immediately underneath the gate to lower the potential barrier in the channel region. As a result, the threshold voltage may decrease to deteriorate the drain-source pressure resistance. In order to avoid these various undesirable effects, including problems of hot electrons, accompanied with the shortening of channel lengths (hereinafter referred to as "short channel effects" in general), there has been proposed MOSFET of LLD structure which are manufactured by means of a self-aligned pocket implantation technique. This technique involves effecting a selective ion implantation into the regions in the vicinity of the gate which contact the source and drain regions and are constituted by a region of impurity with low concentration and a region of impurity with high concentration adjacent thereto, to thereby form impurity regions (pocket regions) of p-type (or n-type), in order to reduce the intensity of electric field at the source and drain-channel interface and to increase the pressure resistance.

Figure 1:
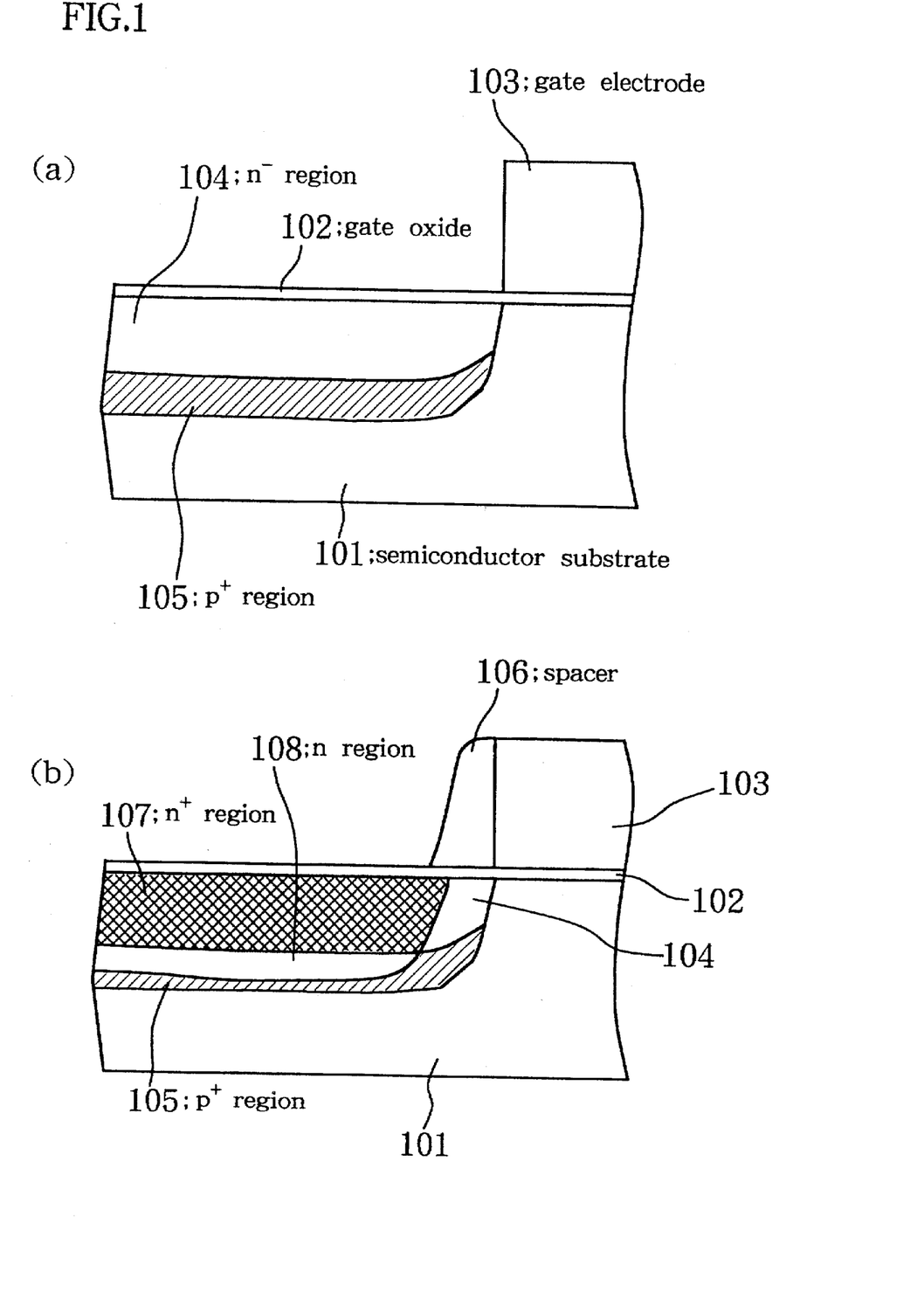
FIGS. 1(a) and 1(b) are schematic sectional views showing a manufacturing method of a conventional semiconductor device.

For example, in the case where an n-channel MOSFET is manufactured, a gate oxide 102 is first deposited on a p-type semiconductor substrate 101, and a gate electrode 103 of a polysilicon having a patterning thereon is formed thereon, as schematically shown in FIG. 1(a). Thereafter, while permitting the gate electrode 103 to function as a mask, n-type impurity ions are implanted into the semiconductor substrate 101 to define n− regions 104 at areas adjacent to the surface of the semiconductor substrate 101, and p-type impurity ions are implanted into the semiconductor substrate 101 to define p$^+$ regions 105 underneath the n− regions 104.

Subsequently, as depicted in FIG. 1(b), a silicon oxide is deposited by means of chemical vapor deposition (CVD) process on the gate electrode 103 and the gate oxide 102 exposed, and then an anisotropic etching is effected by means of a dry etching process to form spacers 106 at the opposite side walls of the gate electrode 103. Thereafter, by implanting n-type impurities while permitting these spacers 106 and the gate electrode 103 to serve as masks, n+ regions 107 and n regions 108 are formed at areas adjacent to the surface of the semiconductor substrate 101. Thus, that portion of each p+ region 105 which is located underneath a respective n− region 104 prevents the depletion layer of the drain and source region from extending to thereby inhibit a drop in threshold voltages.

In the aforementioned process, however, the n− regions 104 are formed by the implantation of n-type impurities and p-type impurities employing the same mask. Consequently, it is difficult to optimally control the impurity concentration in the n− regions 104 underneath the spacers 106, and its stability is poor. Furthermore, in the vicinity of each p+ region 105 underneath a respective n-region 108, there is a significant difference between the n-type impurity concentration and p-type impurity concentration, resulting in deterioration of the pressure resistance and leakage performance thereat.

In order to solve these problems, Japanese Laid-Open Patent Application No. Hei6-326123, has proposed an improvement in the conventional semiconductor-manufacturing method.

Figure 2:
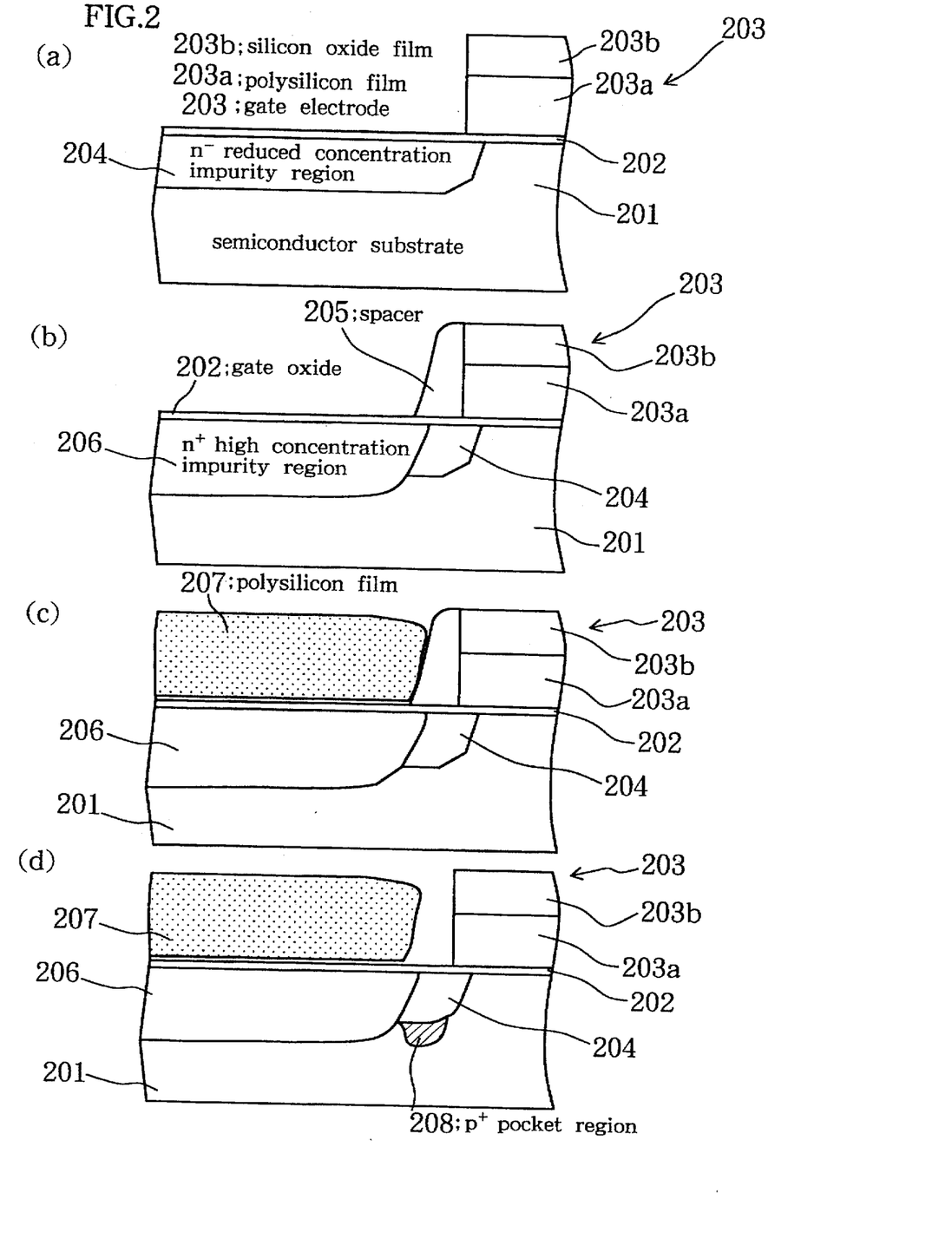
FIGS. 2(a) to 2(d) are schematic sectional views similar to FIGS. 1(a) and 2(b), but showing another manufacturing method of a conventional semiconductor device.

In the manufacturing technique disclosed therein, as shown in FIG. 2(a), a gate oxide 202 is deposited on a semiconductor substrate 201, and a patterned gate electrode 203 including a polysilicon film 203a and a silicon oxide film 203b is formed thereon. Subsequently, while permitting the gate electrode 203 to serve as a mask, n-type impurity ions are implanted into the semiconductor substrate 201 to define n− reduced concentration impurity regions 204 at areas adjacent to the surface of the semiconductor substrate 201. During the implantation, a large angle tilt implantation (LATI) technique is utilized to overlap the n− reduced concentration impurity regions 204 with the gate electrode 203.

Thereafter, as depicted in FIG. 2(b), a silicon oxide is deposited by means of CVD process on the gate electrode 203 and the gate oxide 202 exposed, and then an anisotropic etching is effected by means of a dry etching process to provide spacers 205 at the opposite side walls of the gate electrode 203. Thereafter, by an ion-implantation method which permits these spacers 205 and the gate electrode 203 to serve as masks, n+ high concentration impurity regions 206 are formed at areas adjacent to the surface of the semiconductor substrate 201. Further, as depicted in FIG. 2(c), after a polysilicon is deposited by means of CVD process, an etching is effected by means of a dry etching method to define a polysilicon film 207 so as to remain only on the areas where the source and drain regions are formed. Then, as shown in FIG. 2(d), the spacers 205 are selectively removed, and p-type impurity ions are implanted into the semiconductor substrate 201 to define p+ pocket regions 208 in the regions immediately underneath the spacer-removed regions.

A MOSFET of a LDD structure having the p+ pocket regions 208 only at the desired portions can thus be obtained. In the foregoing, the impurity concentration for the n− reduced concentration impurity regions 204 immediately above the p+ pocket regions 208 can be easily set by the difference between the impurity concentration of the n-type impurity ions to be first implanted and the impurity concentration of p-type impurity ions to be implanted at the formation of the p+ pocket regions 208. Furthermore, the pressure resistance and leakage performance for the regions situated at the bottom of the n+ high concentration impurity regions 206 will not be deteriorated by the provision of the p+ pocket regions 208.

In the aforesaid manufacturing method of MOS devices, however, the gate electrode 203 is of a multi-layered structure which requires a considerable height. Accordingly, its patterning is difficult. In addition, it is difficult to control the formation and removal of the polysilicon film 207, and upon the selective removal of the spacers 205, the configuration of the gate electrode 203 or the like is influenced. Therefore, the manufacturing process becomes complicated, thereby increasing the cost, deteriorating the yield, and lowering the reliability.

SUMMARY OF THE INVENTION

It is therefore an object of the present invention to provide a novel and reliable method for manufacturing a semiconductor device, in particular of a MOS type, while positively preventing adverse short channel effects. Another subject matter of the invention resides in a semiconductor device per se obtained by the application of such a method.

According to a first aspect of the present invention, there is provided a method for manufacturing a semiconductor device having impurity doped regions serving as source and drain, comprising the steps of:

(a) preparing a semiconductor substrate of a first conductive type having a gate oxide thereon;

(b) forming on the gate oxide a gate electrode having opposite side walls;

(c) forming a first dielectric film on the semiconductor substrate including the gate electrode;

(d) implanting impurity ions of a first conductive type into the semiconductor substrate while permitting the gate electrode and the first insulation film formed on the side walls of the gate electrode to serve as self-aligning masks;

(e) causing a second dielectric film to be deposited on the first dielectric film;

(f) effecting an anisotropic etching at least on the second dielectric film, among from the first and second dielectric films, to form on the side walls of the gate electrode spacers having a prescribed profile; and (g) implanting impurity ions of a second conductive type into the semiconductor substrate while permitting the gate electrode and the spacers to serve as self-aligning masks.

In the foregoing, after the implanting step (g), the step (h) of implanting impurity ions of a second conductive type into the semiconductor substrate while permitting the gate electrode and the spacers to serve as masks may be added.

Moreover, it is preferable in the step (e) that a mixture of silicon dioxide, phosphoric glass and boron glass be employed as a material for the second dielectric film, and that an additional step of reflowing the second dielectric film at a temperature of 600 to 900° C. between the step (e) and the step (f) be further added.

Furthermore, in the steps (g) and (h) of implanting impurity ions of the second conductive type, it is preferable that the impurity to be implanted in the step (g) be set to have greater projected ranges than the impurity ions implanted in the step (h).

According to a second aspect of the present invention, there is provided a semiconductor device comprising:

a semiconductor substrate of a first conductive type having a gate oxide thereon;

a gate electrode provided on the gate oxide and having opposite side walls;

a pair of impurity-doped regions provided in the semiconductor substrate for serving as source and drain, the impurity-doped regions being disposed so as to extend away from a respective one of the side walls of the gate electrode;

a pair of spacers disposed on the side walls of the gate electrode so as to be adjacent to a respective one of the side walls of the electrode; and a pair of pocket regions having no impurities of a second conductive type implanted, each of the pocket regions being disposed underneath a respective one of the spacers.

In the foregoing, it is preferable that, at an area other than the pocket regions, a region in which the impurities of a second conductive type be implanted more deeply than the impurities of a first conductive type be provided.

With the above procedures and constructions, when effecting an etching on the first and second dielectric films to produce spacers, the spacer profile is in advance determined such that a desired profile can be obtained in the region underneath the spacer among the regions of the semiconductor substrate where the impurity ions of the second conductive type are to be implanted, and that for the regions underneath the spacers, the impurity ions of the second conductive type are implanted by penetrating the spacers, whereby it is possible to form pocket regions in which desired concentration distribution is attained in desired positions, to positively prevent short channel effects from occurring.

Furthermore, inasmuch as it is possible to control only the conditions for the pocket regions independently, it is possible to optimize the impurity profiles very easily. In addition, due to the formation of the pocket regions, the deterioration of the pressure resistance and leakage performance for the diffusion layers can be prevented.

Additionally, since no complicated manufacturing steps are included, and since the number of steps can be reduced, the manufacturing cost can be reduced significantly while attaining a higher yield.

BRIEF DESCRIPTION OF THE DRAWINGS

The above and other objects, advantages and features of the present invention will be more apparent from the following description taken in conjunction with the accompanying drawings in which.

DESCRIPTION OF THE PREFERRED EMBODIMENTS

Figure 3:
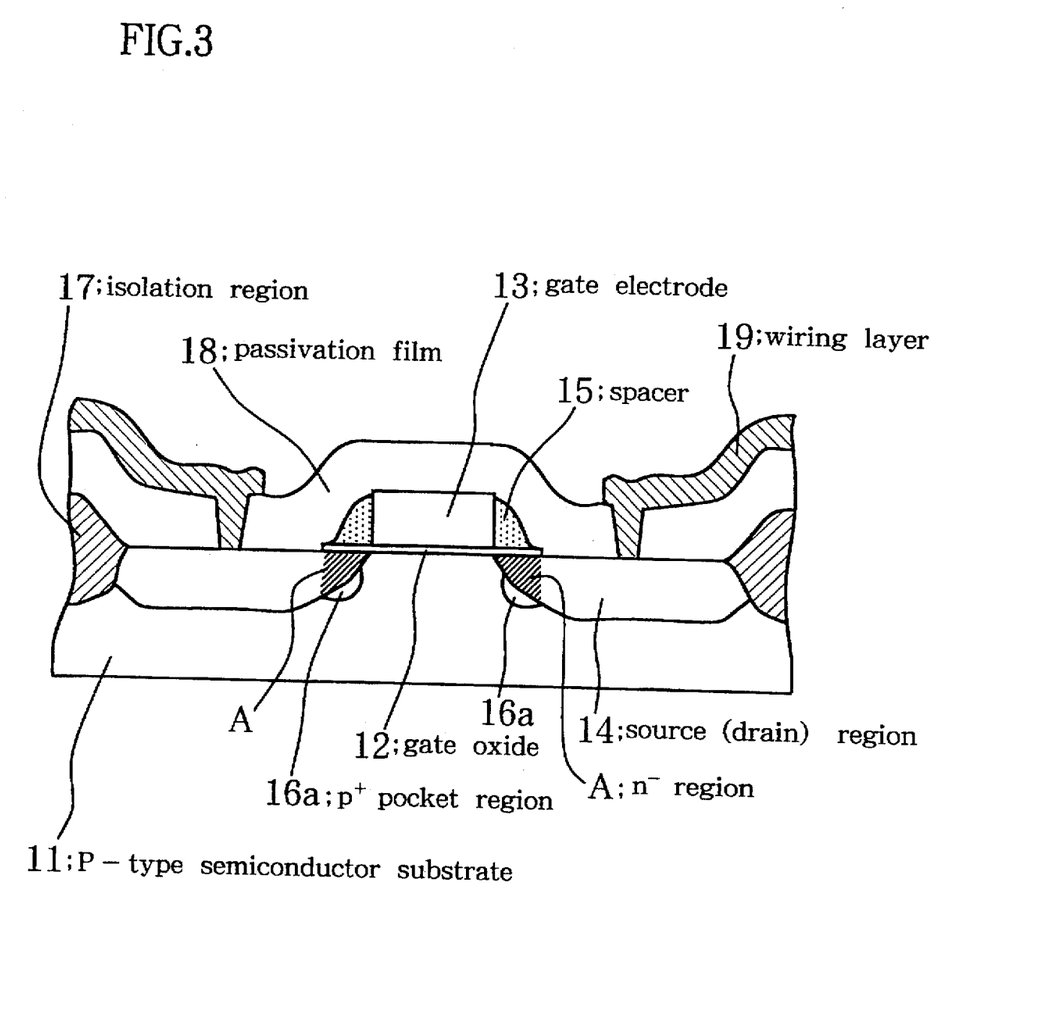
FIG. 3 is a schematic sectional view showing a MOSFET structure in accordance with a first embodiment of the present invention.

FIG. 3 is a cross sectional view partially depicting a stacked structure of a MOSFET in accordance with a first embodiment of the present invention, whereas FIGS. 4(a) to 4(e) are cross-sectional views showing fabrication procedures therefor.

As depicted in FIG. 3, the MOSFET in accordance with this embodiment comprises a p-type semiconductor substrate 11, a gate electrode 13 provided on the substrate 11 through a gate oxide (film) 12 interposed therebetween. Formed on the opposite sides of the gate electrode 13 in the semiconductor substrate 11 in a symmetrical manner are source and drain regions 14 of an n-type, and n– low concentration regions A and A for reducing the intensity of electric field are provided in those parts of the source and drain regions 14 situated underneath the spacers 14 provided adjacent to the side walls of the gate electrode 13. A pair of p+ pocket regions 16a and 16a are formed under the n− regions A and A for preventing the depletion layers from extending from the source and the drain regions 14 into the position immediately underneath the gate electrode 13 to thereby provide a structure to prevent short channel effects. In addition, isolation regions 17 and 17 are formed for the areas other than the element regions, and a passivation film 18 for protection is deposited on that surface of the semiconductor substrate 11 where the gate electrode 13 and the like are formed. Furthermore, a wiring layer 19 is formed by means of aluminum vapor deposition. In the MOSFET as described, an n-channel is formed on the surface of the semiconductor substrate 11 underneath the gate electrode 13 in its activated state.

Next, referring to FIGS. 4(a) to 4(e), fabrication procedural steps for the aforesaid MOSFET will be described.

Figure 4:
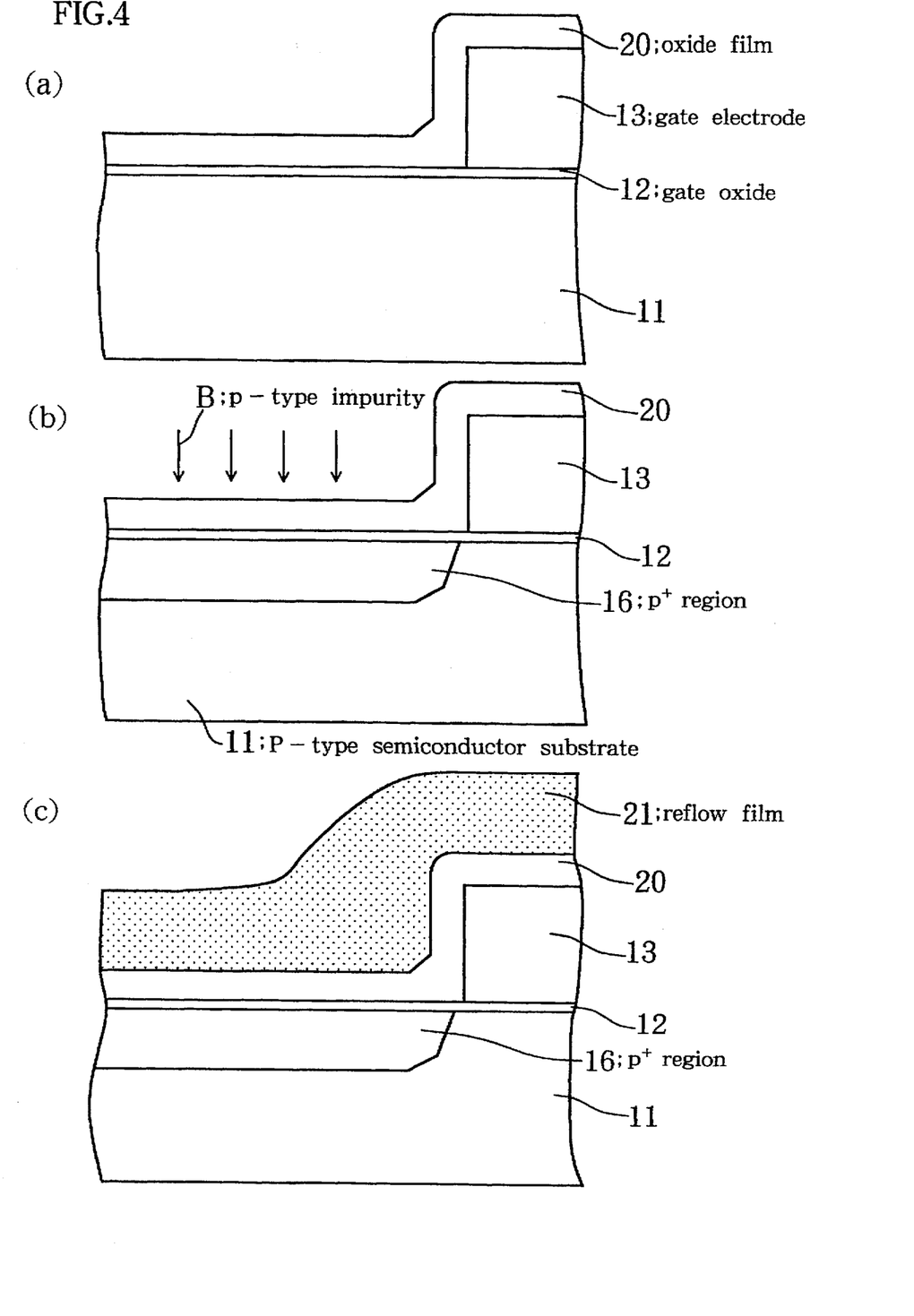
FIGS. 4(a) to 4(e) are schematic sectional views for explaining a manufacturing method in accordance with the first embodiment of the invention applied to manufacture the MOSFET of FIG. 3.

First, as shown in FIG. 4(a), a gate oxide 12 is deposited on the surface of a p-type semiconductor substrate 11, and a gate electrode 13 in which patterning is effected on a polysilicon layer having a thickness of about 150 nm is formed thereon. Then, an oxide film 20 having a thickness of about 30 nm is deposited thereon by means of CVD process.

Thereafter, as shown in FIG. 4(b), p-type impurities B are implanted by means of an ion-implantation technique into the regions adjacent to the surface of the semiconductor substrate 11 to form p+ regions 16. More specifically, boron is implanted as such p-type impurities at a dose of about $5 \times 10^{12}$ cm$^{-2}$ and an acceleration energy of about 10 keV. In the foregoing, since the p+ region 16 is formed by the ion-implantation while being masked by the gate electrode 13 and the oxide film 20 formed adjacent to the side walls thereof, the resulting p+ region is, as shown in FIG. 4(b), displaced outwardly from the region immediately underneath the gate electrode 13.

Thereafter, as depicted in FIG. 4(c), boron phospho silicate glass (BPSG) is deposited on the oxide film 20, and the resulting deposited layer is softened at a temperature of about 900° C. to effect a reflowing to provide a reflow film 21. In this step, an annealing is effected at a temperature of about 900° C. in a nitrogen atmosphere for about 20 minutes. Thus, as shown in FIG. 4(c), the p+ region is more or less enlarged due to thermal diffusion.

Subsequently, as depicted in FIG. 4(d), an etching is effected by means of an anisotropic etching process on the oxide film 20 as well as on the reflow film 21 to provide spacers 15 adjacent to the side walls of the gate electrode 13, each spacer having a thickness of less than that of the gate electrode 13 and having a smooth inclined surface in conformity with the reflow configuration of the reflow film.

In the foregoing, the configuration of the inclined surface of each spacer 15 is determined such that, among the regions of the p-type semiconductor substrate 11 into which n-type impurities C are to be implanted in a later step, that portion situated underneath the spacer 15 has a desired profile.

Thereafter, as shown in FIG. 4(e), n-type impurities C are implanted by means of an ion-implantation process into the p-type semiconductor substrate 11 to form n regions 14a, n+ regions 14b and 14c, and p+ pocket regions 16a.

In this step, arsenic ions are ion-implanted as n-type impurities at a dose of about $2 \times 10^{13}$ cm$^{-2}$ and an acceleration energy of about 40 kev. The ion-implantation conditions such as these dose and acceleration energy are selected for example such that, among the n+ regions 14a, the regions immediately above the p+ pocket regions 16a (i.e., n− regions A in FIG. 3) have a desired n-type impurity concentration. The acceleration energy is set to an energy by which the n-type impurities C do not penetrate the gate electrode 13.

In the foregoing, among the regions into which the n-type impurities C are implanted, the areas underneath the spacers 15 of the regions into which the p-type impurities B were implanted in the previous step remain to serve as the aforesaid p+ pocket regions 16a because they have smooth surfaces generally corresponding to the profiles (configurations of the inclined surfaces) of the spacers 15. These p+ pocket regions 16a function to prevent the depletion layer of the source and drain regions from extending into the position immediately underneath the gate electrode 13 due to the short channel effects. Furthermore, in FIG. 4(e), in the n+ regions 14b (the lower portions of the source and drain region 14), the projected ranges of the n-type impurities C are set longer than those of the p-type impurities B, and the n+ regions 14b having a desired thickness can thus be formed in the above regions.

Thereafter, a passivation film 18 is deposited by means of CVD process on the entire surface, and flattened by heat-treatment. Then, contact holes are formed in prescribed positions on the source and drain region 14, and a wiring layer 19 is formed by means of aluminum vapor deposition to provide a MOSFET.

As described above, with the construction of the present embodiment, inasmuch as the configuration of the inclined surface of each spacer 15 can be determined such that, among the regions of the p-type semiconductor substrate 11 into which n-type impurities C are to be implanted, that portion situated underneath the spacer 15 has a desired profile, the p+ pocket regions 16a having a desired concentration profile can be easily formed at desired positions to prevent the short channel effects positively.

Furthermore, inasmuch as it is possible to control the conditions for the formation af the p+ pocket regions independently, the impurity profile can be easily optimized. In addition, the variation of the impurity concentration in a direction of depth is mild, the pressure resistance and leakage performance can be prevented from deteriorating.

Additionally, since no complicated manufacturing steps are required, and since the number of steps can be reduced, the manufacturing cost can be reduced substantially while attaining a higher yield.

Figure 5:
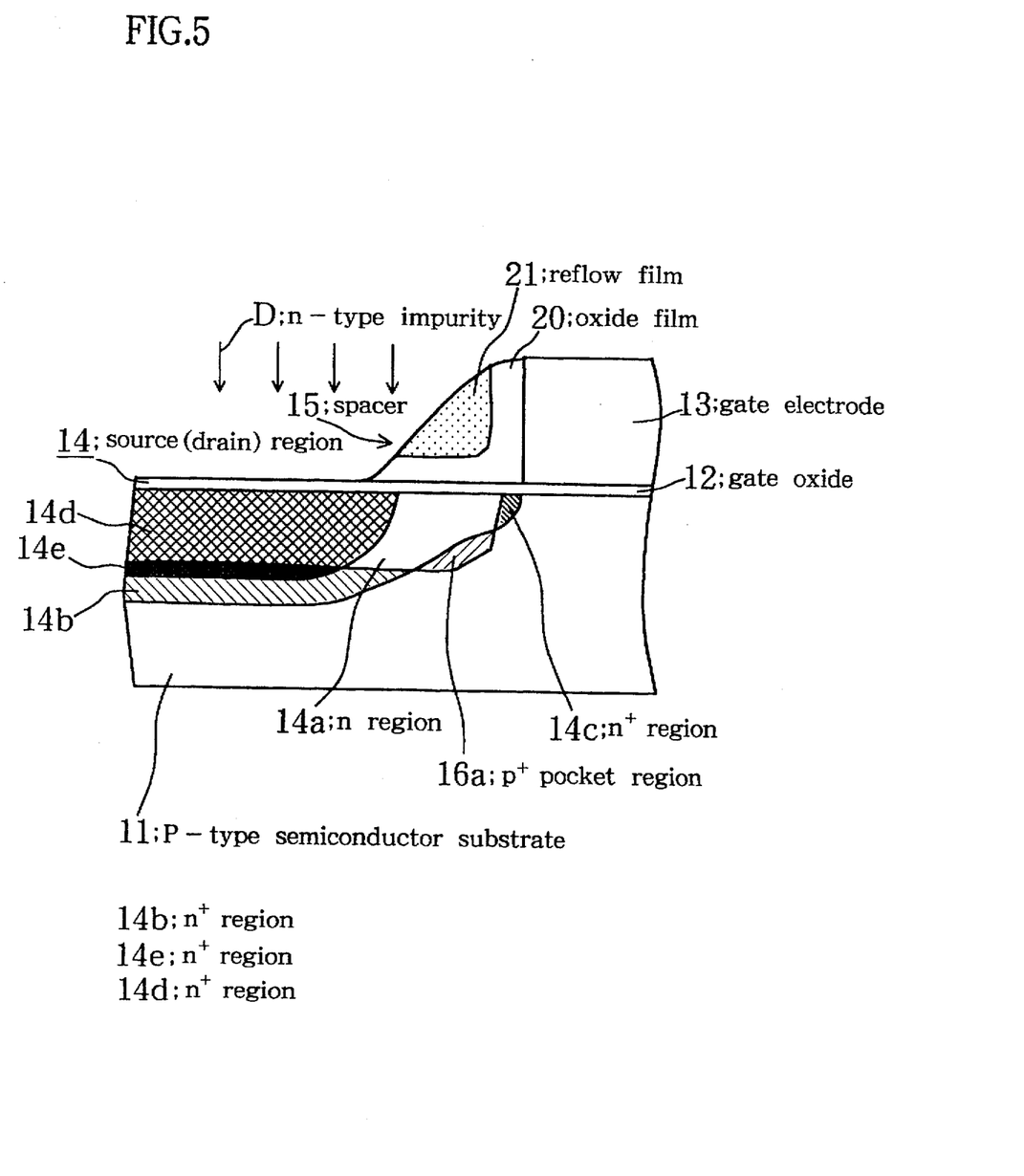
FIG. 5 is a sectional view for explaining a manufacturing method of a MOSFET in accordance with a second embodiment of the present invention.

FIG. 5 is a cross-sectional view for explaining a method of manufacturing a MOSFET in accordance with a second embodiment of the present invention.

The second embodiment differs mainly from the first embodiment in that after the formation of the p+ pocket region 16a (FIG. 4(e)), a further step of effecting ion-implantation of n-type impurities D is added. Since the steps other than this further step are generally similar, only a brief explanation will be given hereinafter.

As shown in FIG. 5, after the step of formation of the p+ pocket regions 16a as illustrated in FIG. 4(e), n-type impurities D are implanted by an ion-implantation process into the p-type semiconductor substrate 11 to produce n+ regions 14d and 14e. In this step, arsenic ions are implanted as n-type impurities D at a dose of about $1 \times 10^{13}$ cm$^{-2}$ and an acceleration energy of about 15 keV.

In this embodiment illustrated, the acceleration energy is set to such an extent as not to penetrate the range half the height of the spacer 15. However, it is possible to set the energy arbitrarily in order to adjust the impurity profiles for the areas underneath the spacers 15.

In this second embodiment, the same advantages as those obtained by the first embodiment can also be ensured. In addition, with a further step of ion-implantation, it is possible to reduce the influence of the p-type impurities B in the areas in which the p-type impurities B are implanted other than the p+ pocket regions 16a. Furthermore, by effecting ion-implantation so as to completely neutralize the areas other than the p+ pocket regions in which areas the p-type impurities B are implanted, it is possible to obtain optimal impurity profiles.

Obviously, many modifications and variations are possible in the light of the foregoing teachings. For example, although in the above embodiments, BPSG consisting of silicon dioxide, phosphoric glass and boron glass is used as the reflow film, zinc glass, arsenic glass or the like may also be employed. In addition, p-channel MOSFET can also be obtained by the application of the above method with the conductive types being reversed. It is thus apparent that the present invention is not limited to the above embodiments but may be changed and modified without departing from the scope and spirit of the invention.

Finally, the present application claims the priority of Japanese Patent Application No. Hei8-331890 filed Dec. 12, 1996, which is herein incorporated by reference.

What is claimed is:

1. A method for manufacturing a semiconductor device having impurity doped regions serving as source and drain, comprising the steps of:

(a) preparing a semiconductor substrate of a first conductive type having a gate oxide thereon;

(b) forming on said gate oxide a gate electrode having opposite side walls;

(c) forming a first dielectric film on said semiconductor substrate including said gate electrode;

(d) implanting impurity ions of a first conductive type into said semiconductor substrate while permitting said gate electrode and said first dielectric film formed on said side walls of said gate electrode to serve as self-aligning mask;

(e) causing a second dielectric film selected from the group consisting of boron phospho-silicate glass, a zinc phospho-silicate glass and an arsenic phospho-silicate glass to be deposited on said first dielectric film;

(f) effecting an anisotropic etching at least one said second dielectric film, among from said first and second dielectric films, to form on said side walls of said gate electrode spacers having a prescribed profile; and (g) implanting impurity ions of a second conductive type into said semiconductor substrate while permitting said gate electrode and said spacers to serve as self-aligning masks.

2. A method as recited in claim 1, comprising, after said implanting step (g), the step (h) of implanting impurity ions of a second conductive type into said semiconductor substrate while permitting said gate electrode and said spacers to serve as masks.

3. A method as recited in claim 1, wherein said step (e) comprises using a boron phospho-silicate glass as said second dielectric film.

4. A method as recited in claim 1, further comprising an additional step of reflowing said second dielectric film at a temperature of 600 to 900° C. between said step (e) and said step (f).

5. A method as recited in claim 2, wherein the impurity ions of the second conductive type implanted in said step (g) are set to have greater projected ranges than the impurity ions of the second conductive type implanted in said step (h).

* * * * *